US009213786B2

(12) United States Patent
Glasscock et al.

(10) Patent No.: US 9,213,786 B2
(45) Date of Patent: Dec. 15, 2015

(54) MANUFACTURING SYSTEMS AND METHODS

(71) Applicant: The Boeing Company, Chicago, IL (US)

(72) Inventors: Alan D. Glasscock, Freeland, WA (US); Rich H. Morihara, Bellevue, WA (US); David J. Odendahl, Kirkland, WA (US); Frederick J. Richter, Everett, WA (US); Chris Stedman, Bellevue, WA (US); Sidlaghatta N. Venkatesh, Renton, WA (US)

(73) Assignee: The Boeing Company, Chicago, IL (US)

( * ) Notice: Subject to any disclaimer, the term of this patent is extended or adjusted under 35 U.S.C. 154(b) by 386 days.

(21) Appl. No.: 13/771,748

(22) Filed: Feb. 20, 2013

(65) Prior Publication Data

US 2014/0236334 A1     Aug. 21, 2014

(51) Int. Cl.
*G06F 19/00* (2011.01)
*G06F 17/50* (2006.01)
*G05B 19/4097* (2006.01)
*G05B 19/418* (2006.01)

(52) U.S. Cl.
CPC ........ *G06F 17/5004* (2013.01); *G05B 19/4097* (2013.01); *G05B 19/41805* (2013.01); *G05B 2219/33257* (2013.01); *G05B 2219/35082* (2013.01); *G05B 2219/35223* (2013.01); *G05B 2219/37617* (2013.01)

(58) Field of Classification Search
USPC ................................... 700/195, 119; 382/190
See application file for complete search history.

(56) References Cited

U.S. PATENT DOCUMENTS

| 5,828,377 | A  | * | 10/1998 | Muro et al. .................... 345/420 |
| 6,618,505 | B2 |   | 9/2003  | Cork |
| 2001/0046323 | A1 |   | 11/2001 | Cork |
| 2006/0269368 | A1 |   | 11/2006 | Skiles |
| 2007/0112453 | A1 |   | 5/2007  | Auriol et al. |
| 2007/0191981 | A1 | * | 8/2007  | Huang et al. .................. 700/166 |
| 2008/0105763 | A1 | * | 5/2008  | Fahy et al. .................... 239/373 |

(Continued)

FOREIGN PATENT DOCUMENTS

| EP | 2533167 A2 | 12/2012 |
| FR | 2940375 A1 | 6/2010 |

OTHER PUBLICATIONS

International Search Report and Written Opinion for International Application No. PCT/US2014/011490 mailed on May 28, 2014.

*Primary Examiner* — Kidest Bahta
(74) *Attorney, Agent, or Firm* — Toler Law Group, PC

(57) ABSTRACT

Manufacturing systems and methods are disclosed. In one example, a computer based system comprises a non-transitory computer readable memory, a processor, and logic instructions stored in the non-transitory computer readable memory. When executed by the processor, the logic instructions configure the processor to perform operations, comprising receiving a first digital map of a first component and a second digital map of a second component, defining a first surface on the first component and a second surface on the second component, wherein at least a portion of the first surface is to adjoin at least a portion of the second surface in a manufactured assembly, updating a first part definition for the first component to include the first surface and, optionally, updating a second part definition for the second component to include the second surface.

21 Claims, 5 Drawing Sheets

(56) References Cited

U.S. PATENT DOCUMENTS

| | | |
|---|---|---|
| 2008/0110275 A1 | 5/2008 | Odendahl |
| 2008/0205763 A1 | 8/2008 | Marsh |
| 2008/0223985 A1 | 9/2008 | Marsh et al. |
| 2012/0260186 A1* | 10/2012 | Blackham et al. ............ 715/738 |
| 2012/0316666 A1* | 12/2012 | Boyl-Davis et al. ............ 700/98 |

* cited by examiner

MANUFACTURING SYSTEMS AND METHODS

BACKGROUND

The subject matter described herein relates to manufacturing techniques and, more particularly, to computer-based systems and methods to manufacture adjoining parts which fit together with tight tolerances.

There are inherent variations between the virtual environment of computer-based design and the real environment of manufacturing a physical component. Existing manufacturing techniques cope with these variations by providing allowances in part dimensions to accommodate the stack-up of tolerances in adjoining parts. For example, custom-machined fillers (i.e., shims) are commonly used to fill the gaps between adjacent structures.

Existing processes, associated with the use of shims, contribute to increased production time and expense in manufacturing assemblies such as aircraft, vehicles, or other vessels and structures.

SUMMARY

It is desirable to provide systems and methods to eliminate, or at least to reduce, the need for custom-machined fillers.

In one example, a computer based system comprises a non-transitory computer readable memory, a processor, and logic instructions stored in the non-transitory computer readable memory. When executed by the processor, the logic instructions configure the processor to perform operations, comprising receiving a first digital map of a first component and a second digital map of a second component, defining a first surface on the first component and a second surface on the second component, wherein at least a portion of the first surface is to adjoin at least a portion of the second surface in a manufactured assembly, updating a first part definition for the first component to include the first surface and updating a second part definition for the second component to include the second surface.

In another example, a computer based method comprises receiving, in a computer-based processing device, a first digital map of a first component and a second digital map of a second component, defining, in the computer-based processing device, a first surface on the first component and a second surface on the second component, wherein at least a portion of the first surface is to adjoin at least a portion of the second surface in a manufactured assembly, updating, in the computer-based processing device, a first part definition for the first component to include the first surface, and updating, in the computer-based processing device, a second part definition for the second component to include the second surface.

In another example, a computer program product comprises logic instructions stored on a non-transitory computer readable medium. When executed by the processor, the logic instructions configure the processor to perform operations, comprising receiving a first digital map of a first component and a second digital map of a second component, defining a first surface on the first component and a second surface on the second component, wherein at least a portion of the first surface is to adjoin at least a portion of the second surface in a manufactured assembly, updating a first part definition for the first component to include the first surface and updating a second part definition for the second component to include the second surface.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

Examples of methods and systems in accordance with the teachings of the present disclosure are described in detail below with reference to the following drawings.

DETAILED DESCRIPTION

Systems and methods to manufacture adjoining parts are described herein. In some examples, systems and methods described herein may be used in the manufacture of adjoining parts in vehicles such as aircraft, ships, automobiles, or any other structures in which adjacent parts must be joined. By way of example, aircraft structures commonly include a thin skin formed from aluminum, metal, or composite materials attached to an underlying frame structure, typically within extremely tight tolerances.

As described above, existing manufacturing techniques commonly use custom-fit shims to compensate for variations in part dimensions. Techniques described herein eliminate, or at least reduce, the need for shims by creating digital maps of adjoining portions of adjacent components, defining adjoining surfaces of the components, and generating an updated part definition for the adjacent components that includes the adjoining surface definitions. In some examples, components may be formed in an initial state in which the adjoining portions of adjacent parts are formed with additional sacrificial material in areas which are to be adjoining other components. For example, adjacent sections of an aircraft skin may be formed such that the adjoining portions are slightly thicker than a sum of the applicable design tolerances. At least one digital map of adjoining portions of adjacent structures may be generated using one or more digital imaging techniques. Digital maps of adjoining parts may be used to update a copy of the respective part definitions of the adjoining parts that are provided to computer-based machining tools such that the respective parts can be machined to fit without shims.

Figure 1:
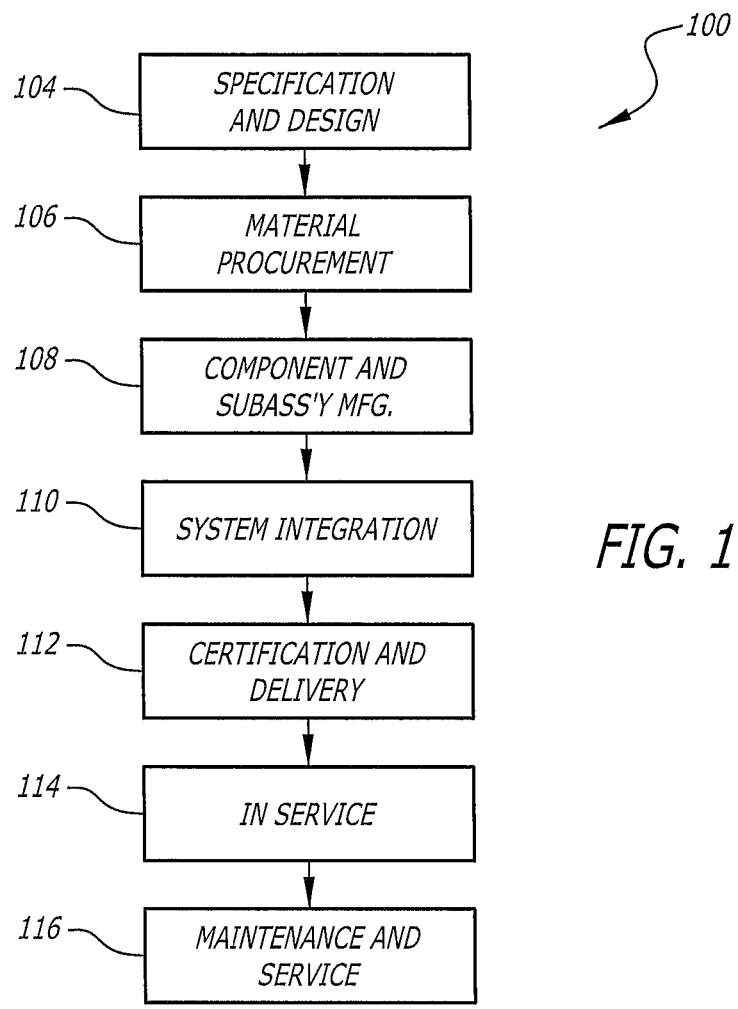
FIG. 1 is a flow diagram of aircraft production and service methodology.
Figure 2:
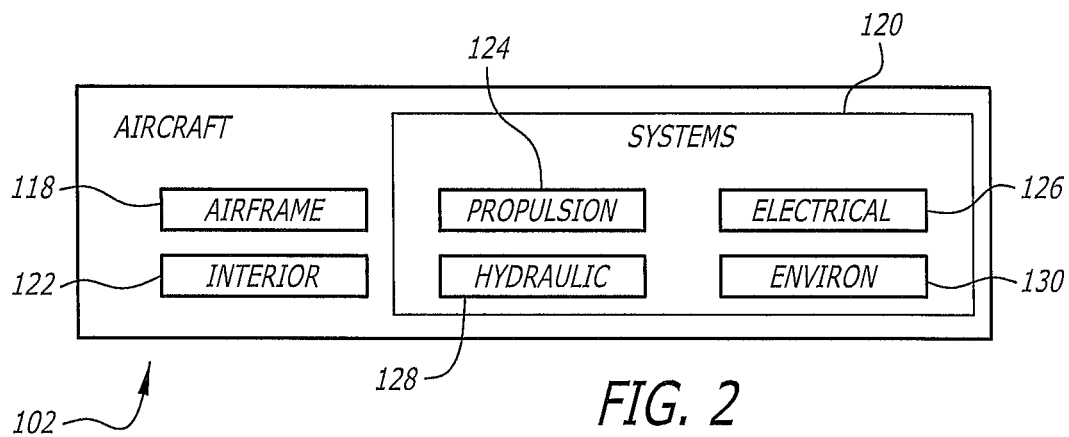
FIG. 2 is a block diagram of an aircraft.

Referring more particularly to the drawings, aspects of the disclosure may be described in the context of an aircraft manufacturing and service method 100 as shown in FIG. 1 and an aircraft 102 as shown in FIG. 2. During pre-production, exemplary method 100 may include specification and design 104 of the aircraft 102 and material procurement 106. During production, component and subassembly manufacturing 108 and system integration 110 of the aircraft 102 takes place. Thereafter, the aircraft 102 may go through certification and delivery 112 in order to be placed in service 114.

While in service by a customer, the aircraft 102 is scheduled for routine maintenance and service 116 (which may also include modification, reconfiguration, refurbishment, and so on).

Each of the processes of method 100 may be performed or carried out by a system integrator, a third party, and/or an operator (e.g., a customer). For the purposes of this description, a system integrator may include without limitation any number of aircraft manufacturers and major-system subcontractors; a third party may include without limitation any number of venders, subcontractors, and suppliers; and an operator may be an airline, leasing company, military entity, service organization, and so on.

As shown in FIG. 2, the aircraft 102 produced by exemplary method 100 may include an airframe 118 with a plurality of systems 120 and an interior 122. Examples of high-level systems 120 include one or more of a propulsion system 124, an electrical system 126, a hydraulic system 126, and an environmental system 130. Any number of other systems may be included. Although an aerospace example is shown, the principles of the disclosure may be applied to other industries, such as the automotive industry.

Apparatus and methods embodied herein may be employed during any one or more of the stages of the production and service method 100. For example, components or subassemblies corresponding to production process 108 may be fabricated or manufactured in a manner similar to components or subassemblies produced while the aircraft 102 is in service. Also, one or more apparatus examples, method examples, or a combination thereof may be utilized during the production stages 108 and 110, for example, by substantially expediting assembly of or reducing the cost of an aircraft 102. Similarly, one or more of apparatus examples, method examples, or a combination thereof may be utilized while the aircraft 102 is in service, for example and without limitation, to maintenance and service 116.

Figure 3:
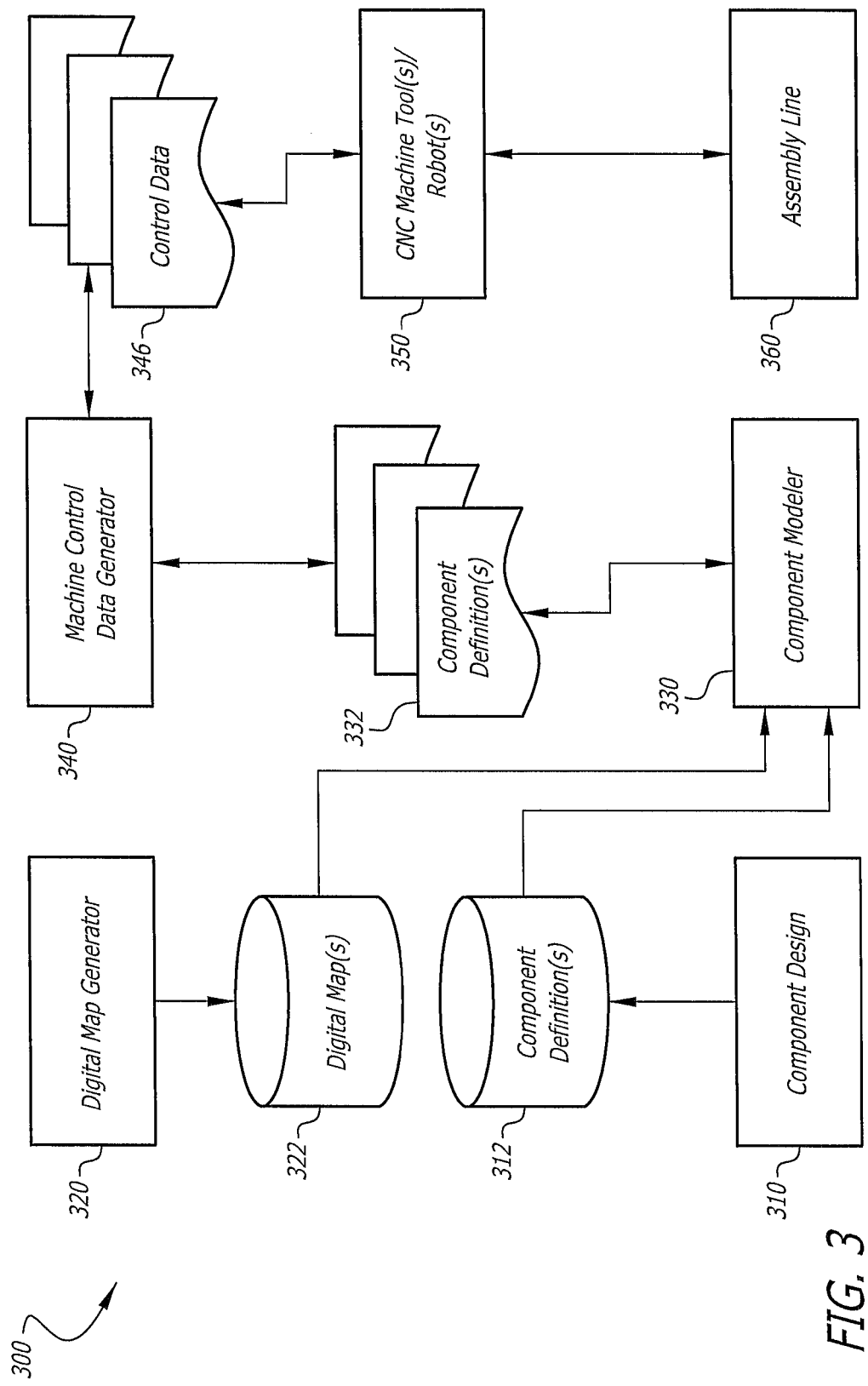
FIG. 3 is a schematic illustration of an environment for manufacturing systems and methods according to one or more aspects of the disclosure.

FIG. 3 is a schematic, high-level illustration of an environment for manufacturing systems and methods according to one or more aspects of the disclosure. Referring to FIG. 3, in some examples, the environment 300 comprises a component design module 310 which is communicatively coupled to a component definition data store 312 and a digital map generator 320 which is communicatively coupled to a digital map data store 322.

Environment 300 further comprises a component modeler 330 which generates one or more modified component definitions 332 and a machine control data generator 340 which generates control data 346. Environment 300 further includes at least one computer/numeric controlled (CNC) machine tool(s) and/or robot(s) 350 and may include an assembly line 360.

In the context of an environment to manufacture an aircraft, at least portions of the component design module 310, the component modeler 330, and the machine control data generator 340 may be implemented as logic instructions stored on a computer readable medium and executable by a processor, e.g., software. Similarly, the digital map generator 320 and the machine tool(s) and/or robot(s) 350 may comprise logic instructions stored on a computer readable medium and executable by a processor, e.g., software.

In some examples, the various data stores 312, 322, 332, 346 may be implemented as databases or as flat files stored on a computer readable medium. The component definitions data store 312 may be used to store digital representations of component design layouts, while the digital maps data store 322 may be used to digital representations of actual components, e.g., three-dimensional (3D) scans of adjoining portions of components. The data in data stores 312, 322, 332, 346 may be stored in a suitable computer readable storage medium, e.g., a magnetic storage medium, an optical storage medium, or combinations thereof.

The digital map generator and the machine tool(s) may be embodied as modular components which are functionally separate from the component design module 310, the component modeler 330, and the machine control data generator 340. In some examples, the machine control data 346 may be implemented as logic instructions encoded in a computer readable medium and executable on a processor which control the machine tool(s) and/or robot(s) 350.

Figure 4:
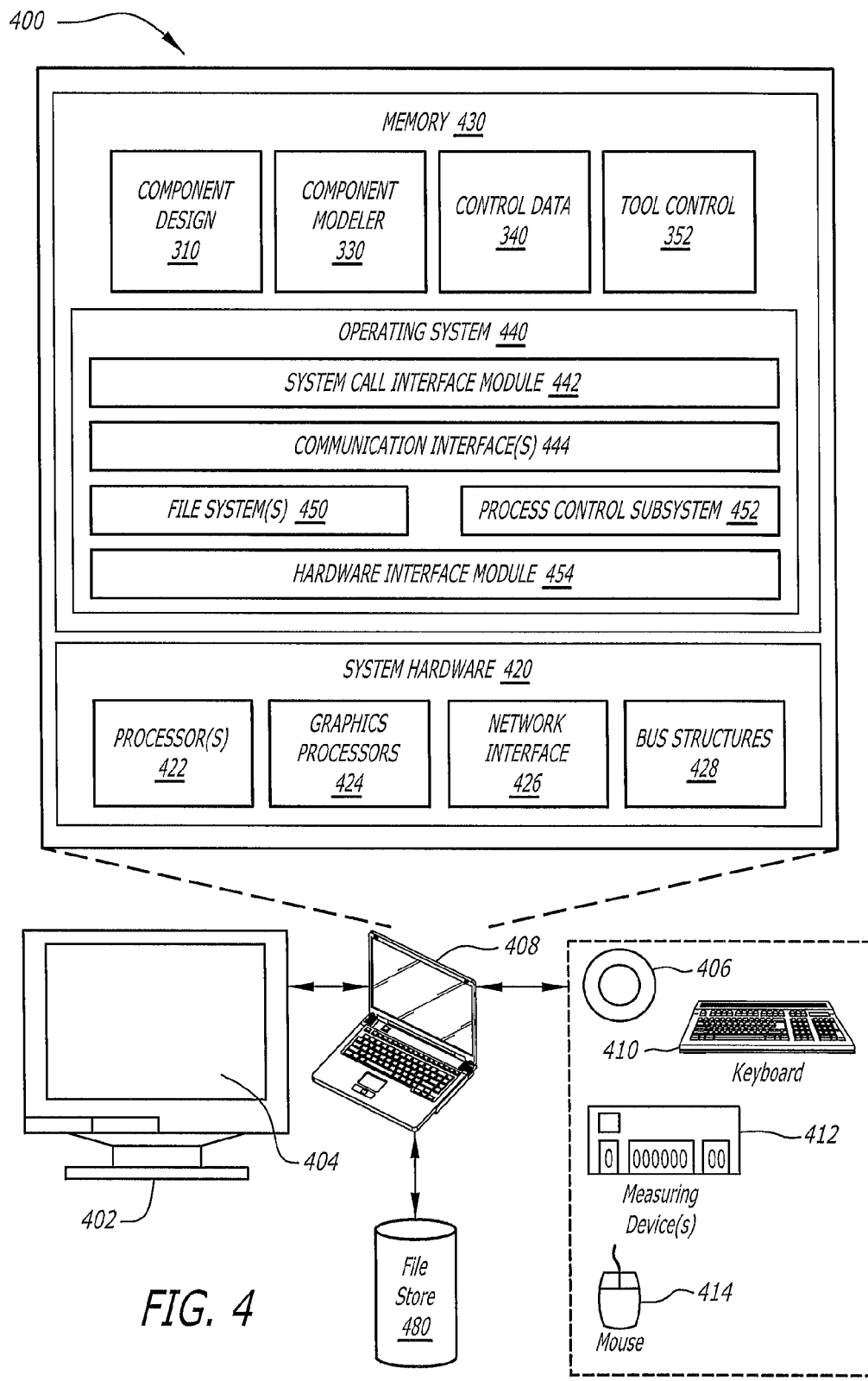
FIG. 4 is a schematic illustration of a computing device which may be adapted to implement systems and methods for manufacturing in accordance with some aspects of the disclosure.

In some examples, one or more components of the system 300 depicted in FIG. 1 may be implemented in a computer system environment. FIG. 4 is a schematic illustration of a computing system environment 400 which may be adapted to implement systems and methods for manufacturing in accordance with some aspects of the disclosure. In one example, system 400 includes one or more computing devices 408 and one or more accompanying input/output devices including a display 402 having a screen 404, one or more speakers 406, a keyboard 410, one or more external measuring device(s) 412, and a mouse 414. The other I/O device(s) 412 may include a touch screen, a voice-activated input device, a track ball, and any other device that allows the system 400 to receive input from a user.

The computing device 408 includes system hardware 420 and memory 430, which may be implemented as random access memory and/or read-only memory. A file store 480 may be communicatively coupled to computing device 408. File store 480 may be internal to computing device 408 such as, e.g., one or more hard drives, CD-ROM drives, DVD-ROM drives, or other types of storage devices. File store 480 may also be external to computer 408 such as, e.g., one or more external hard drives, network attached storage, or a separate storage network.

System hardware 420 may include one or more processors 422, a two graphics processor(s) 424, network interfaces 426, and bus structures 428. As used herein, the term "processor" means any type of computational element, such as but not limited to, a microprocessor, a microcontroller, a complex instruction set computing (CISC) microprocessor, a reduced instruction set (RISC) microprocessor, a very long instruction word (VLIW) microprocessor, or any other type of processor or processing circuit.

Graphics processor(s) 424 may function as adjunct processors that manage graphics and/or video operations. Graphics processor(s) 424 may be integrated onto the motherboard of computing system 400 or may be coupled via an expansion slot on the motherboard.

In one example, network interface 426 could be a wired interface such as an Ethernet interface (see, e.g., Institute of Electrical and Electronics Engineers/IEEE 802.3-2002) or a wireless interface such as an IEEE 802.11a, b or g-compliant interface (see, e.g., IEEE Standard for IT-Telecommunications and information exchange between systems LAN/MAN—Part II: Wireless LAN Medium Access Control (MAC) and Physical Layer (PHY) specifications Amendment 4 : Further Higher Data Rate Extension in the 2.4 GHz Band, 802.11G-2003). Another example of a wireless interface would be a general packet radio service (GPRS) interface (see, e.g., Guidelines on GPRS Handset Requirements, Global System for Mobile Communications/GSM Association, Ver. 3.0.1, December 2002).

Bus structures 428 connect various components of system hardware 428. In one example, bus structures 428 may be one or more of several types of bus structure(s) including a memory bus, a peripheral bus or external bus, and/or a local bus using any variety of available bus architectures including, but not limited to, 11-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

Memory 430 may include an operating system 440 for managing operations of computing device 408. In one example, operating system 440 includes a hardware interface module 454 that provides an interface to system hardware 420. In addition, operating system 440 may include a file system 450 that manages files used in the operation of computing device 408 and a process control subsystem 452 that manages processes executing on computing device 408.

Operating system 440 may include (or manage) one or more communication interfaces that may operate in conjunction with system hardware 420 to transceive data packets and/or data streams from a remote source. Operating system 440 may further include a system call interface module 442 that provides an interface between the operating system 440 and one or more application modules resident in memory 430. Operating system 440 may be embodied as a Windows® brand operating system or as a UNIX operating system or any derivative thereof (e.g., Linux, Solaris, etc.), or other operating systems.

In various aspects of the disclosure, the computing device 408 may be embodied as one or more computer-based systems such as a personal computer, a laptop computer, a server, or a networked computing device. In some examples, the various components of the system 300 described with reference to FIG. 3 may be implemented as logic instructions stored in the memory 430 and executable on one or more processors 422 of the computing device. By way of example, the example depicted in FIG. 4 includes a component design module 310, a component modeler module 330, a machine control data generator module 340, and a tool control module 352 to implement the operations described with reference to FIG. 5.

Figure 5:
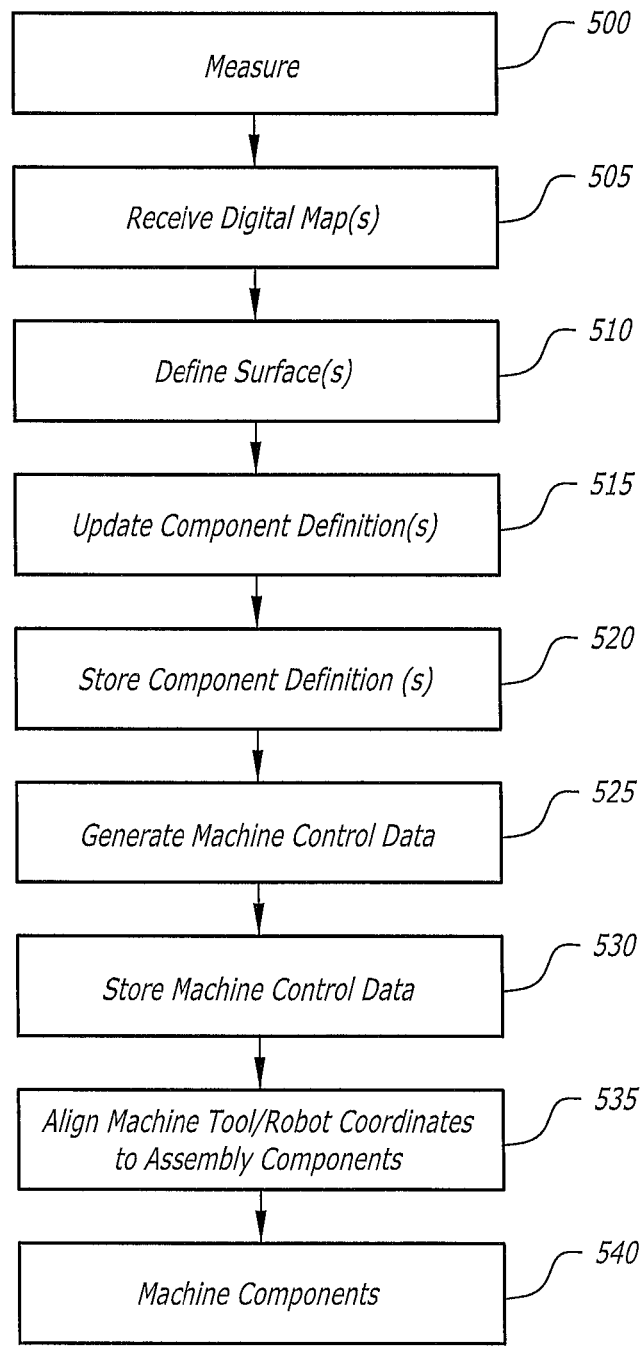
FIG. 5 is a flowchart illustrating operations in a method for manufacturing according to one or more aspects of the disclosure.

Having described the various components of a manufacturing system 400, various operations of the system components will now be described. FIG. 5 is a flowchart illustrating operations in a manufacturing method according to one or more aspects of the disclosure. Referring now to FIG. 5, at operation 500 two or more adjoining components are measured, and at operation 505 one or more digital maps of adjoining portions of components that are to be adjacent in a final assembly are received in a computer-based system such as the system 400 depicted in FIG. 4. By way of example, a first digital map of a first component and a second digital map of a second component may be received.

The digital maps may comprise a 3D mapping of adjoining portions of components such as sections of an aircraft skin or adjacent structural components such as a wing assembly and a fuselage or adjacent sections of a fuselage. The first digital map my comprise a 3D representation of the first component and the second digital map may comprise a 3D representation of the second component. The specific components are not critical. The 3D representation may be in the form of a cloud of points, or it may be in a CAD surface definition.

Figure 6:
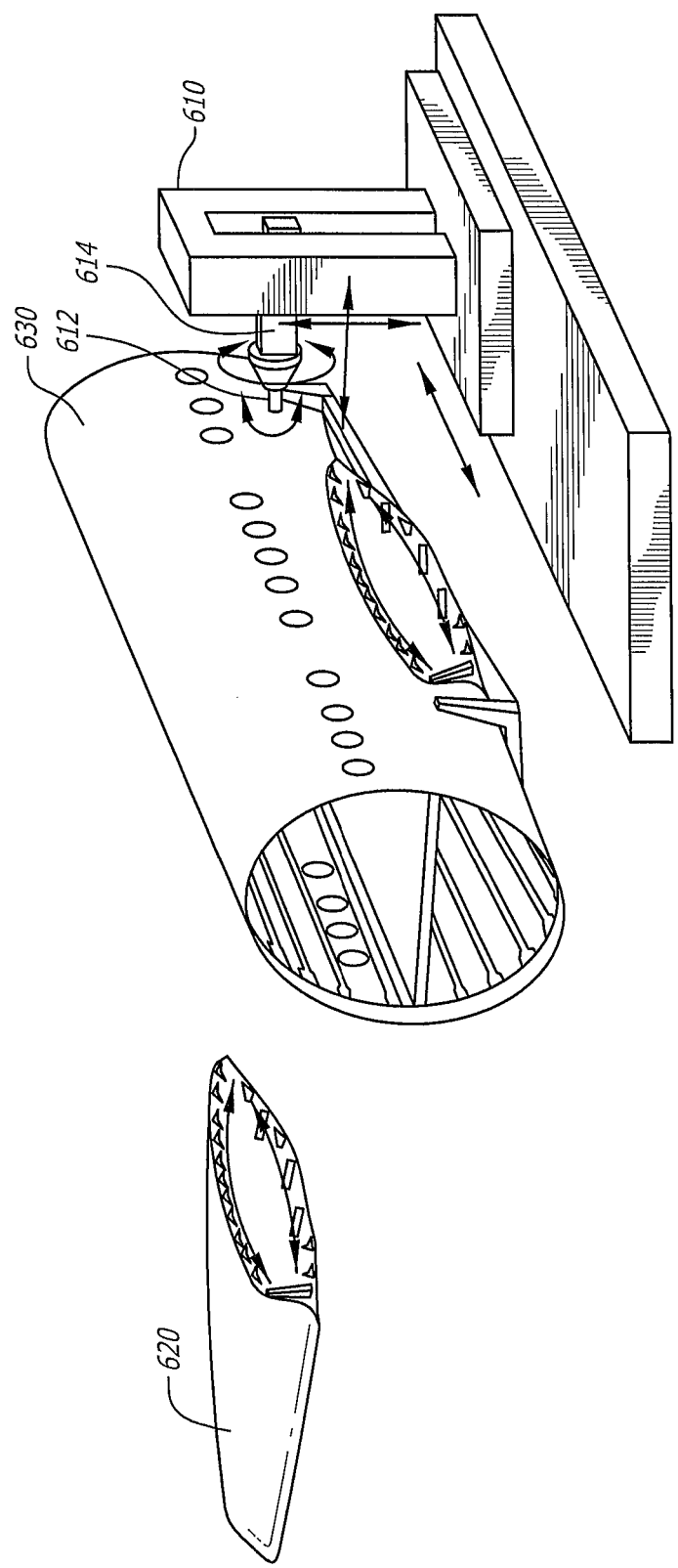
FIG. 6 is a schematic illustration of an environment to generate a three-dimensional map of adjoining components, according to the various aspects of the disclosure.

In some examples, the 3D mapping of the components may be generated by a scanning device separate from the system 400. By way of example, FIG. 6 illustrates an example in which a 3D scanning device 610 may be used to scan the features that provide a physical interface between one or more wing assemblies 620 and a fuselage 630. The scanning device 610 may comprise a probe 612 rotatably mounted on a spindle 614. The scanning device 610 may be mounted on a platform capable to provide relative motion in 3 or more axes between the scanning device 610 and the component being scanned. By way of example, in some aspects, the scanning device 610 may be embodied as a portable Coordinate Measurement Machine (CMM), a laser tracker, laser radar, photogrammetry, or other technology.

In operation, scanning device 610 generates 3D digital maps of the locations and orientations of all the features that provide the physical interfaces of sections of components that are to be adjacent in a final assembly. The 3D digital maps may be stored in a computer readable memory such as the digital map data store 322. The data store 322 may be integrated into system 400 or may be separate from system 400 and communicatively coupled to system 400 by a suitable communication link.

Referring back to FIG. 5, at operation 510 the component modeler 330 may define a first surface on the first component and a second surface on the second component, wherein at least a portion of the first surface is to adjoin at least a portion of the second surface in a manufactured assembly. In some examples, the first component may be designed by the component design module 310 with additional sacrificial material in portions of the first component surrounding the first surface. Similarly, the second component may be designed by the component design module 310 with additional sacrificial material in portions of the second component surrounding the second surface. The sacrificial material forms part of the initial design, which is stored in the component definition data store 312.

The component modeler 330 may receive digital maps from the digital map store 322 and the component definitions from the data store 312 and may perform an analysis of each feature of the first component and the mating feature of the second component. An adjusting function may performed for each component feature to assure that the respective components can be individually machined to a final configuration where the mating features will properly align for full surface to surface contact, thereby eliminating the need for a filler when the assembly process commences. The adjustments may be made in three dimensional space using translations and/or rotations of the respective digital maps. In the event that the configuration of the assembly joint may require that a gap is needed to assure that one structural element can be moved into proper alignment a pre-produced constant thickness filler can be machined in advance and installed immediately following the joining of the two structures when required.

At operation 515 the component modeler 330 generates updated component definitions for the first component and the second component which define the respective first and second surfaces. The updated component definitions may be stored in a data store 322 and may include the adjustment data for the respective components. The component definitions in data store 312 remain unchanged. Instead, a copy of component definition for each component is generated and updated to reflect particular features of the specific assembly. This process acknowledges that each assembly is a custom design that represents the actual assembly condition of the respective components that comprise the assembly joint features. At operation 520 the component definitions and the adjustment data may be stored in a data store 332.

At operation 525 the machine control data generator 340 generate first machine control data to CNC control machine tool and/or robot(s) 350 to remove an amount of sacrificial material from the first component to define the first surface and may also generate a second set of machine control data to control an automatic machine tool to remove an amount of sacrificial material from the second component to define the second surface. As described above, component may be designed with sacrificial material on the mating surface utilized in the assembly. This material is intended to be machined in such a manner that full surface to surface contact can be achieved thus eliminating the need for gap measurement, filler machining, and delayed assembly processes. The machine control data may be adjusted geometrically to accommodate the unique orientation and generate machining operations for the material to be machined and utilize specialized cutting tools custom designed for specific machining conditions on specific material. All of these adjustments may be based on all of the updated part definitions data for the specific components. At operation 530 the machine control data may be stored in a data store 346.

At operation 535 the tool control module 352 aligns the coordinate system of machine tool(s) and/or robot(s) 350 used to remove the sacrificial material from the components. This alignment may be implemented either externally or internally to the machine tool. Some machine tools are capable of performing the measurement and translation/rotation of virtual axes systems internally. In some examples, the component may be moved to an orientation in front of a multi-axis machine where the component's joint features are exposed to the machine so the component can be machined. The machine tool(s) and or robot(s) 350 may utilize measurement and scanning techniques to establish the orientation of the assembly and translates and rotates the machine control data 346 to align the data to the actual orientation of the component.

At operation 540 the machine tool control module 352 controls the machine tool(s) and or robot(s) 350 to machine the components. In some examples, the machine tool control module 352 executes first control data to remove an amount of sacrificial material from the first component to define the first surface and executes second control data to remove an amount of sacrificial material from the second component to define the second surface. Each component may be machined to a calculated dimension based on the 3D map and adjusted based on the multiple geometric measurement analyses which will yield mating assemblies that able to met-up with near-zero part gaps.

Once the respective components have been machined they may be moved to an assembly point and assembled.

Thus, described herein are computer based systems and methods for manufacturing adjoining surfaces of parts which are to be adjacent in a final assembly. In brief, the systems and methods utilize 3D scanning data to modify component definitions generated by a design process to define mating surfaces. The modified component definitions may then be used to generate control data for a machine tool, which removes sacrificial material from the components to define mating surfaces.

In the foregoing discussion, specific implementations of exemplary processes have been described, however, it should be understood that in alternate implementation, certain acts need not be performed in the order described above. In alternate examples, some acts may be modified, performed in a different order, or may be omitted entirely, depending on the circumstances. Moreover, in various alternate implementations, the acts described may be implemented by a computer, controller, processor, programmable device, firmware, or any other suitable device, and may be based on instructions stored on one or more computer-readable media or otherwise stored or programmed into such devices (e.g. including transmitting computer-readable instructions in real time to such devices). In the context of software, the acts described above may represent computer instructions that, when executed by one or more processors, perform the recited operations. In the event that computer-readable media are used, the computer-readable media can be any available media that can be accessed by a device to implement the instructions stored thereon.

While various examples have been described, those skilled in the art will recognize modifications or variations which might be made without departing from the present disclosure. The examples illustrate the various aspects of the disclosure and are not intended to limit the present disclosure. Therefore, the description and claims should be interpreted liberally with only such limitation as is necessary in view of the pertinent prior art.

What is claimed is:

1. A computer-based system, comprising:
a non-transitory computer readable medium;
a processor; and
logic instructions stored in the non-transitory computer readable medium which, when executed by the processor, configure the processor to perform operations, comprising:
receiving a first digital map of a first component and a second digital map of a second component, wherein the first component comprises a first sacrificial material;
defining a first surface of the first component based on a determination of an amount of the first sacrificial material to remove from the first component;
defining a second surface of the second component, wherein at least a portion of the first surface is to adjoin at least a portion of the second surface in a manufactured assembly;
storing a first part definition for the first component, the first part definition describing the first surface; and
storing a second part definition for the second component, the second part definition describing the second surface.

2. The computer-based system of claim 1, wherein the first part definition and the second part definition are stored in the non-transitory computer readable medium.

3. The computer-based system of claim 1, wherein:
the first digital map comprises a three-dimensional representation of the first component; and
the second digital map comprises a three-dimensional representation of the second component.

4. The computer-based system of claim 1,
wherein the second component comprises second sacrificial material in a region surrounding the second surface.

5. The computer-based system of claim 4, further comprising logic instructions stored in the non-transitory computer readable medium which, when executed by the processor, configure the processor to perform operations, comprising:
defining the second surface on the second component based on a determination of an amount of the second sacrificial material to remove from the second component.

6. The computer-based system of claim 5, further comprising logic instructions stored in the non-transitory computer readable medium which, when executed by the processor, configure the processor to perform operations, comprising:

generating first control data to control an automatic machine tool to remove an amount of the first sacrificial material from the first component defining the first surface; and generating second control data to control the automatic machine tool to remove an amount of the second sacrificial material from the second component defining the second surface; and store the first control data and the second control data in the non-transitory computer readable medium.

7. The computer-based system of claim 6, further comprising logic instructions stored in the non-transitory computer readable medium which, when executed by the processor, configure the processor to perform operations, comprising:

executing the first control data to remove the amount of the first sacrificial material from the first component defining the first surface; and execute the second control data to remove the amount of the second sacrificial material from the second component defining the second surface.

8. A computer-based method, comprising:

receiving, in a computer-based processing device, a first digital map of a first component and a second digital map of a second component, wherein the first component comprises first sacrificial material;

defining, in the computer-based processing device, a first surface of the first component by determining an amount of the first sacrificial material to remove from the first component;

defining, in the computer-based processing device, a second surface of the second component, wherein at least a portion of the first surface is to adjoin at least a portion of the second surface in a manufactured assembly;

storing, in the computer-based processing device, a first part definition for the first component, the first component part definition describing the first surface; and storing, in the computer-based processing device, a second part definition for the second component, the first component part definition describing the second surface.

9. The computer-based method of claim 8, wherein the first part definition and the second part definition are stored in a non-transitory computer readable medium.

10. The computer-based method of claim 8, wherein:

the first digital map comprises a three-dimensional representation of the first component; and the second digital map comprises a three-dimensional representation of the second component.

11. The computer-based method of claim 10, wherein the second component comprises second sacrificial material in a region surrounding the second surface.

12. The computer-based method of claim 11, further comprising defining the second surface on the second component by determining an amount of the second sacrificial material to remove from the second component.

13. The computer-based method of claim 12, further comprising:

generating first control data to control an automatic machine tool to remove an amount of the first sacrificial material from the first component defining the first surface; and generating second control data to control an automatic machine tool to remove an amount of the second sacrificial material from the second component defining the second surface; and storing the first control data and the second control data in a non-transitory computer readable memory.

14. The computer-based method of claim 13, further comprising:

executing the first control data to remove the amount of the first sacrificial material from the first component defining the first surface; and executing the second control data to remove the amount of the second sacrificial material from the second component defining the second surface.

15. A computer program product comprising logic instructions stored on a non-transitory computer readable medium which, when executed by a processor, configure the processor to perform operations, comprising:

receiving a first digital map of a first component and a second digital map of a second component wherein the first component comprises first sacrificial material;

defining a first surface of the first component based on a determination of an amount of the first sacrificial material to remove from the first component;

defining a second surface of the second component, wherein at least a portion of the first surface is to adjoin at least a portion of the second surface in a manufactured assembly;

storing a first part definition for the first component, the first component part definition describing the first surface; and storing a second part definition for the second component, the second component part definition describing to include the second surface.

16. The computer program product of claim 15, wherein the first part definition and the second part definition are stored in the non-transitory computer readable medium.

17. The computer program product of claim 15, wherein:

the first digital map comprises a three-dimensional representation of the first component; and the second digital map comprises a three-dimensional representation of the second component.

18. The computer program product of claim 17, wherein the second component comprises second sacrificial material in a region surrounding the second surface.

19. The computer program product of claim 18, further comprising logic instructions stored in the non-transitory computer readable medium which, when executed by the processor, configure the processor to perform operations, comprising:

defining the second surface on the second component based on a determination of an amount of the second sacrificial material to remove from the second component.

20. The computer program product of claim 19, further comprising logic instructions stored in the non-transitory computer readable medium which, when executed by the processor, configure the processor to perform operations, comprising:

generating first control data to control an automatic machine tool to remove an amount of the first sacrificial material from the first component defining the first surface; and generating second control data to control the automatic machine tool to remove an amount of the second sacrificial material from the second component defining the second surface; and storing the first control data and the second control data in the non-transitory computer readable medium.

21. The computer program product of claim 20, further comprising logic instructions stored in the non-transitory computer readable medium which, when executed by the processor, configure the processor to perform operations, comprising:
  executing the first control data to remove the amount of the first sacrificial material from the first component defining the first surface; and
  executing the second control data to remove an amount of the second sacrificial material from the second component defining the second surface.

* * * * *